(12) United States Patent
Kamakura et al.

(10) Patent No.: US 10,714,316 B2
(45) Date of Patent: Jul. 14, 2020

(54) METHOD OF MANUFACTURING SEMICONDUCTOR DEVICE

(71) Applicant: KOKUSAI ELECTRIC CORPORATION, Tokyo (JP)

(72) Inventors: Tsukasa Kamakura, Toyama (JP); Kazuhiro Morimitsu, Toyama (JP); Hideharu Itatani, Toyama (JP); Eisuke Nishitani, Toyama (JP); Shun Matsui, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/133,247

(22) Filed: Sep. 17, 2018

(65) Prior Publication Data

US 2019/0244790 A1 Aug. 8, 2019

(30) Foreign Application Priority Data

Feb. 6, 2018 (JP) .................. 2018-019245

(51) Int. Cl.
*H01J 37/32* (2006.01)
*C23C 16/455* (2006.01)
(Continued)

(52) U.S. Cl.
CPC ...... *H01J 37/32449* (2013.01); *C23C 16/345* (2013.01); *C23C 16/4557* (2013.01); *C23C 16/4586* (2013.01); *C23C 16/45542* (2013.01); *C23C 16/45565* (2013.01); *C23C 16/505* (2013.01); *H01J 37/32458* (2013.01); *H01J 37/32724* (2013.01); *H01J 37/32834* (2013.01); *H01L 21/0217* (2013.01);
(Continued)

(58) Field of Classification Search
CPC .......... C23C 16/45565; H01J 37/32449; H01J 37/32458; H01J 37/32724; H01J 37/32834; H01L 21/02274; H01L 21/0228
See application file for complete search history.

(56) References Cited

U.S. PATENT DOCUMENTS

2002/0025691 A1 2/2002 Ohmi et al.
2006/0216419 A1* 9/2006 Shero .................. C23C 16/4481
427/248.1
(Continued)

FOREIGN PATENT DOCUMENTS

JP 2008-277762 A 11/2008
JP 2015-092533 A 5/2015
(Continued)

OTHER PUBLICATIONS

Japanese Office Action dated Dec. 17, 2019 for the Japanese Patent Application No. 2018-019245.
(Continued)

*Primary Examiner* — Kelly M Gambetta
(74) *Attorney, Agent, or Firm* — Volpe and Koenig, P.C.

(57) ABSTRACT

There is provided a technique that includes supplying a first process gas to a process space where a substrate is accommodated, and using an inert gas as a carrier gas of the first process gas; and supplying plasma of a second process gas to the process space where the substrate is accommodated, and using an active auxiliary gas as a carrier gas of the second process gas.

19 Claims, 6 Drawing Sheets

(51) Int. Cl.
  *H01L 21/02* (2006.01)
  *C23C 16/34* (2006.01)
  *C23C 16/505* (2006.01)
  *C23C 16/458* (2006.01)

(52) U.S. Cl.
  CPC .... *H01L 21/0228* (2013.01); *H01L 21/02211* (2013.01); *H01L 21/02274* (2013.01)

(56) References Cited

U.S. PATENT DOCUMENTS

| | | | |
|---|---|---|---|
| 2008/0264337 A1* | 10/2008 | Sano | C23C 16/4408 118/704 |
| 2012/0100722 A1 | 4/2012 | Asai et al. | |
| 2012/0276751 A1 | 11/2012 | Sano et al. | |
| 2013/0189854 A1* | 7/2013 | Hausmann | H01L 21/0217 438/792 |
| 2014/0273530 A1* | 9/2014 | Nguyen | H01L 21/0217 438/792 |
| 2015/0093913 A1* | 4/2015 | Toyoda | C23C 16/45557 438/769 |
| 2015/0099372 A1* | 4/2015 | Chandrasekharan | H01L 21/0228 438/761 |
| 2015/0259799 A1 | 9/2015 | Motoyama et al. | |
| 2015/0371875 A1 | 12/2015 | Sasaki et al. | |
| 2015/0376789 A1 | 12/2015 | Motoyama et al. | |

FOREIGN PATENT DOCUMENTS

| | | |
|---|---|---|
| JP | 2015-173154 A | 10/2015 |
| KR | 20020086638 A | 11/2002 |
| KR | 20120105339 A | 9/2012 |

OTHER PUBLICATIONS

Taiwanese Office Action dated Sep. 19, 2019 for the Taiwanese Patent Application No. 107132094.
Korean Office Action dated Aug. 28, 2019 for the Korean Patent Application No. 10-2018-0110975.
Taiwanese Office Action dated Feb. 14, 2020 for the Taiwanese Patent Application No. 107132094.
Korean Office Action dated Apr. 8, 2020 for the Korean Patent Application No. 10-2018-0110975.

* cited by examiner

METHOD OF MANUFACTURING SEMICONDUCTOR DEVICE

CROSS-REFERENCE TO RELATED APPLICATION

This application is based upon and claims the benefit of priority from Japanese Patent Application No. 2018-019245, filed on Feb. 6, 2018, the entire contents of which are incorporated herein by reference.

TECHNICAL FIELD

The present disclosure relates to a method of manufacturing a semiconductor device.

BACKGROUND

As one of the manufacturing processes of a semiconductor device, there is a process of forming a film on a substrate by performing a cyclic process that alternately supplies a first processing gas such as a precursor gas and plasma of a second processing gas such as a reaction gas to the substrate such as a wafer.

SUMMARY

Some embodiments of the present disclosure provide a technique capable of favorably processing a substrate.

According to one embodiment of the present disclosure, there is provided a technique that includes supplying a first process gas to a process space where a substrate is accommodated, and using an inert gas as a carrier gas of the first process gas; and supplying plasma of a second process gas to the process space where the substrate is accommodated, and using an active auxiliary gas as a carrier gas of the second process gas.

DETAILED DESCRIPTION

One Embodiment of the Present Disclosure

One embodiment of the present disclosure will now be described with reference to the drawings.

(1) Configuration of the Substrate Processing Apparatus

First, a configuration of a substrate processing apparatus according to one embodiment of the present disclosure will be described.

The substrate processing apparatus according to the present embodiment is used in the manufacturing process of a semiconductor device and is configured as a single-wafer-type substrate processing apparatus that processes substrates one by one.

As the substrates to be processed, for example, semiconductor wafer substrates (hereinafter, simply referred to as "wafers") in which a semiconductor integrated circuit device (semiconductor device) is embedded may be used.

Examples of a process performed by the substrate processing apparatus include an oxidation process, a diffusion process, reflow and annealing for carrier activation or planarization after ion doping, a film-forming process, and the like. In the present embodiment, particularly, a case where the film-forming process is performed is taken as an example.

Hereinafter, a configuration of the substrate processing apparatus according to the present embodiment will be described with reference to FIG. 1.

Figure 1:
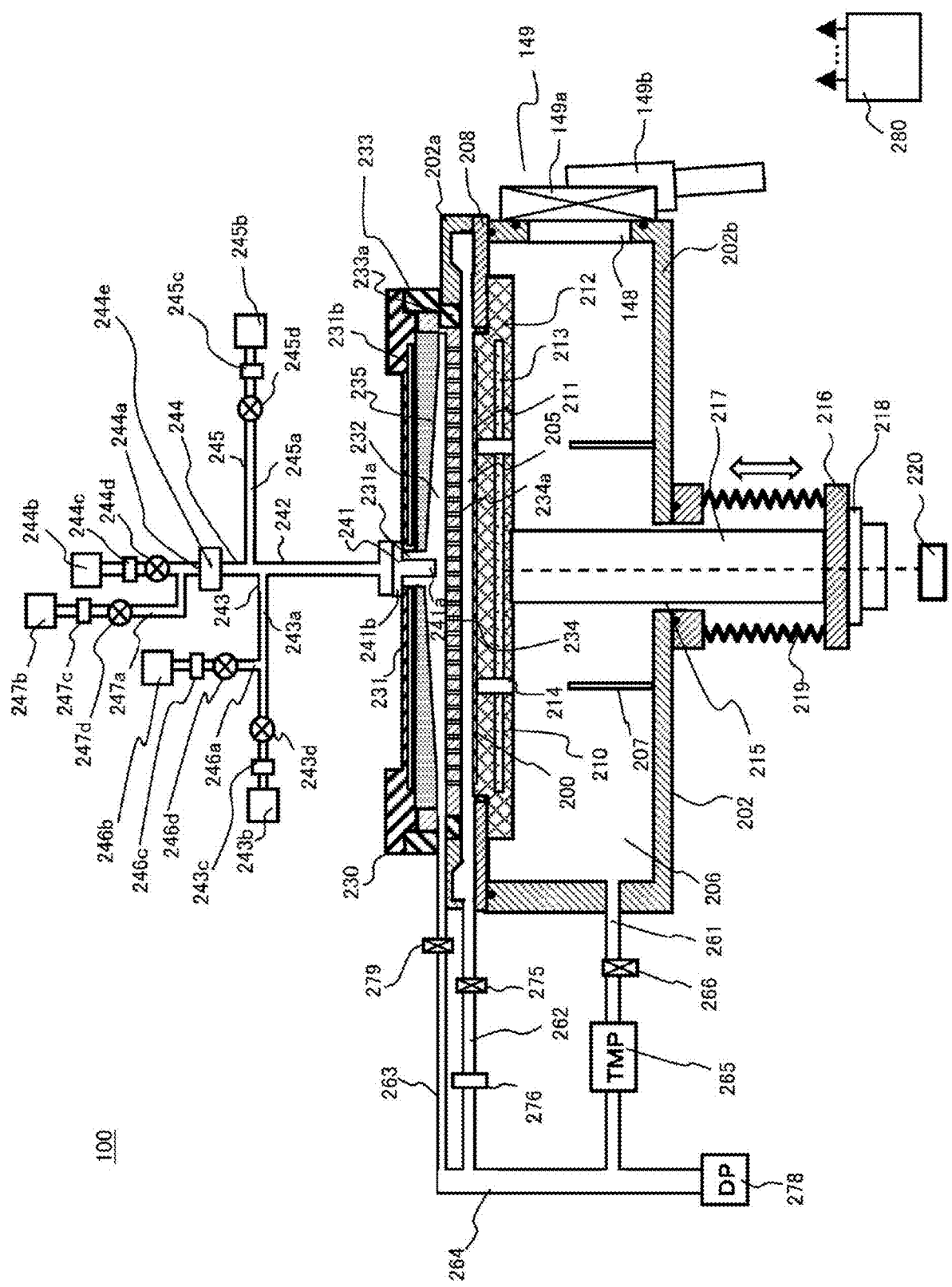
FIG. 1 is a side cross sectional view schematically illustrating a configuration example of a substrate processing apparatus according to one embodiment of the present disclosure.

FIG. 1 is a side sectional view schematically illustrating a configuration example of the substrate processing apparatus according to the present embodiment.

(Chamber)

As illustrated in FIG. 1, the substrate processing apparatus 100 includes a chamber 202 as a process vessel. The chamber 202 is configured as, for example, a flat sealed vessel having a circular cross section. The chamber 202 is made of a metal material such as, e.g., aluminum (Al) or stainless steel (SUS). A process space 205 configured to process a wafer 200 such as a silicon wafer as a substrate and a transfer space 206 through which the wafer 200 passes when the wafer 200 is transferred to the process space 205 are formed in the chamber 202. The chamber 202 is constituted by an upper vessel 202a and a lower vessel 202b. A partition plate 208 is installed between the upper vessel 202a and the lower vessel 202b.

A substrate loading/unloading port 148 adjacent to a gate valve 149 is installed on the side surface of the lower vessel 202b, and the wafer 200 is moved to a transfer chamber (not shown) via the substrate loading/unloading port 148. A plurality of lift pins 207 are installed at the bottom of the lower vessel 202b. Furthermore, the lower vessel 202b is grounded.

The gate valve 149 has a valve body 149a and a driving body 149b. The valve body 149a is fixed to a portion of the driving body 149b. When the gate valve 149 is opened, the driving body 149b moves away from the chamber 202 to separate the valve body 149a from the sidewall of the chamber 202. When the gate valve is closed, the driving body 149b moves toward the chamber 202 and closes the valve body 149a so as to press the valve body 149a against the sidewall of the chamber 202.

A substrate support part 210 for supporting the wafer 200 is installed within the process space 205. The substrate support part 210 mainly has a substrate mounting surface 211 on which the wafer 200 is mounted, a substrate mounting table 212 having the substrate mounting surface 211 on its surface, and a heater 213 as a heating source included in the substrate mounting table 212. Through holes 214 through which the lift pins 207 penetrate are installed on the substrate mounting table 212 at positions corresponding to the lift pins 207, respectively. A temperature control part 220 configured to control the temperature of the heater 213 is connected to the heater 213.

The substrate mounting table 212 is supported by a shaft 217. A support part of the shaft 217 penetrates a hole 215 formed on the bottom wall of the chamber 202, and further, is connected to an elevating mechanism 218 outside the chamber 202 via a support plate 216. Then, the wafer 200 mounted on the substrate mounting surface 211 can be moved up and down by operating the elevating mechanism 218 to move the shaft 217 and the substrate mounting table 212 up and down. The periphery of the lower end portion of the shaft 217 is covered with a bellows 219. Thus, the interior of the chamber 202 is kept sealed.

The substrate mounting table 212 is moved down to a position where the substrate mounting surface 211 faces the substrate loading/unloading port 148 when the wafer 200 is transferred. Furthermore, as illustrated in FIG. 1, the wafer 200 is moved up until it reaches a processing position within the process space 205 when the wafer 200 is processed.

Specifically, when the substrate mounting table 212 is moved down to a wafer transfer position, the upper end portions of the lift pins 207 protrude from the upper surface of the substrate mounting surface 211 so that the lift pins 207 support the wafer 200 from below. In addition, when the substrate mounting table 212 is moved up to the wafer processing position, the lift pins 207 are buried from the upper surface of the substrate mounting surface 211 so that the substrate mounting surface 211 supports the wafer 200 from below. Since the lift pins 207 make direct contact with the wafer 200, it is desirable that the lift pins 207 be made of a material such as, e.g., quartz or alumina.

(Shower Head)

A shower head 230 as a gas dispersion mechanism is installed in an upper portion (at an upstream side) of the process space 205. A through hole 231a into which a first dispersion mechanism 241 is inserted is formed in a lid 231 of the shower head 230. The first dispersion mechanism 241 has a leading end portion 241a inserted into the shower head and a flange 241b fixed to the lid 231.

The leading end portion 241a has a columnar shape and is formed in, for example, a cylinder shape. A dispersion hole is formed on the side surface of the cylinder. A gas supplied from a gas supply part (supply system) of the chamber, which will be described later, is supplied to a buffer space 232 via the leading end portion 241a.

The shower head 230 includes a dispersion plate 234 as a second dispersion mechanism for dispersing a gas. An upstream side of the dispersion plate 234 is the buffer space 232, and a downstream side thereof is the process space 205. A plurality of through holes 234a are formed on the dispersion plate 234. The dispersion plate 234 is disposed to face the substrate mounting surface 211.

A shower head heating part 231b configured to heat the shower head 230 is installed in the lid 231. The shower head heating part 231b heats the gas supplied to the buffer space 232 to a temperature at which the gas does not re-liquefy. For example, it is controlled to heat to about 100 degrees C.

The dispersion plate 234 is formed in, for example, a disc shape. The through holes 234a are formed to be distributed in the entire surface of the dispersion plate 234. The adjacent through holes 234a are arranged at, for example, equal distances. Furthermore, the through holes 234a arranged at the outermost periphery are arranged outside the outer periphery of the wafer mounted on the substrate mounting table 212.

In addition, the shower head 230 has a gas guide 235 configured to guide the gas supplied from the first dispersion mechanism 241 to the dispersion plate 234. The gas guide 235 has a shape whose diameter increases toward the dispersion plate 234, and the inside of the gas guide 235 has a horn shape (for example, also referred to as a cone shape or a spindle shape). A lower end of the gas guide 235 is formed so as to be located more outward than the through holes 234a formed at the outermost peripheral side of the dispersion plate 234.

A support block 233 of the shower head 230 is mounted on a flange of the upper vessel 202a to be fixed. Furthermore, the dispersion plate 234 is mounted on a flange 233a of the support block 233 to be fixed. In addition, the lid 231 is fixed to the upper surface of the support block 233. With this structure, it is possible to remove the lid 231, the dispersion plate 234, and the support block 233 sequentially from above.

(Gas Supply System)

The first dispersion mechanism 241 that is also a gas supply pipe on the chamber side is connected to the gas introduction hole 231a formed in the lid 231 of the shower head 230. A common gas supply pipe 242 is connected to the first dispersion mechanism 241. A flange is installed in the first dispersion mechanism 241, is fixed to the lid 231 by screws or the like, and is fixed to a flange of the common gas supply pipe 242.

The first dispersion mechanism 241 and the common gas supply pipe 242 communicate with each other inside the pipe. Therefore, the gas supplied from the common gas supply pipe 242 is supplied into the shower head 230 through the first dispersion mechanism 241 and the gas introduction hole 231a.

A first gas supply pipe 243a, a second gas supply pipe 244a, and a third gas supply pipe 245a are connected to the common gas supply pipe 242. The second gas supply pipe 244a is connected to the common gas supply pipe 242 through a remote plasma unit (RPU) 244e as a plasma generation part configured to excite a gas in a plasma state, as will be described in detail later.

One of the process gases (hereinafter, referred to as a "first process gas") is mainly supplied from a first gas supply system 243 including the first gas supply pipe 243a and another one of the process gases (hereinafter, referred to as a "second process gas") is mainly supplied from a second gas supply system 244 including the second gas supply pipe 244a. For example, an inert gas is supplied from a third gas supply system 245 including the third gas supply pipe 245a.

(First Gas Supply System)

A first gas supply source 243b, a mass flow controller (MFC) 243c that is a flow rate controller (flow rate control part), and a valve 243d that is an opening/closing valve, are installed in the first gas supply pipe 243a sequentially from the corresponding upstream side. Then, the first process gas is supplied from the first gas supply pipe 243a to the shower head 230 via the MFC 243c, the valve 243d, and the common gas supply pipe 242.

The first process gas is a precursor gas containing a first element. Here, the first element is, for example, silicon (Si). That is, the first element-containing gas is, for example, a silicon-containing gas. Specifically, as the silicon-containing gas, it may be possible to use, for example, a dichlorosilane ($SiH_2Cl_2$, abbreviation: DCS) gas. In addition, the first element-containing gas may be any of a solid, a liquid, and a gas under a room temperature and an atmospheric pressure. In the case where the first element-containing gas is a liquid under a room temperature and an atmospheric pressure, a vaporizer (not shown) may be installed between the first gas supply source 24b and the MFC 243c. Here, it will be described as a gas.

The first gas supply system 243 (hereinafter, also referred to as a "silicon-containing gas supply system") is mainly configured by the first gas supply pipe 243a, the MFC 243c, and the valve 243d. The first gas supply source 243b and the common gas supply pipe 242 may be regarded as being included in the first gas supply system 243.

(First Inert Gas Supply System)

A downstream end of a first inert gas supply pipe 246a is connected to the first gas supply pipe 243a at the downstream side of the valve 243d. An inert gas supply source 246b, an MFC 246c, and a valve 246d are installed in the first inert gas supply pipe 246a sequentially from the corresponding upstream side. Then, an inert gas is supplied from the first inert gas supply pipe 246a to the shower head 230 via the MFC 246c, the valve 246d, the first gas supply pipe 243a, and the common gas supply pipe 242.

Here, the inert gas acts as a carrier gas of the first process gas. Specifically, as the inert gas, it may be possible to use, for example, a nitrogen ($N_2$) gas.

A first inert gas supply system is mainly configured by the first inert gas supply pipe 246a, the MFC 246c, and the valve 246d. The inert gas supply source 246b and the first gas supply pipe 243a may be regarded as being included in the first inert gas supply system.

Furthermore, the first inert gas supply system may be regarded as being included in the first gas supply system 243.

(Second Gas Supply System)

The RPU 244e is installed in the second gas supply pipe 244a at its downstream side. A second gas supply source 244b, an MFC 244c, and a valve 244d are installed at its upstream side sequentially from the corresponding upstream side. Then, the second processing gas is supplied from the second gas supply pipe 244a into the shower head 2 via the MFC 244c, the valve 244d, the RPU 244e, and the common gas supply pipe 242. The second process gas becomes active species in a plasma state by the RPU 244e and is irradiated to the wafer 200.

The second process gas is a gas containing a second element different from the first element. Here, the second element is, for example, any one of oxygen (O), nitrogen (N), and carbon (C). In the present embodiment, it is assumed that the second element-containing gas is, for example, a nitrogen-containing gas. Specifically, an ammonia ($NH_3$) gas is used as the nitrogen-containing gas. The second process gas as the second element-containing gas may be regarded as a reaction gas or a modifying gas.

The second gas supply system (hereinafter, also referred to as a "nitrogen-containing gas supply system") 244 is mainly configured by the second gas supply pipe 244a, the MFC 244c, and the valve 244d. The second gas supply source 244b, the RPU 244e, and the common gas supply pipe 242 may be regarded as being included in the second gas supply system 244.

(Active Auxiliary Gas Supply System)

A downstream end of an active auxiliary gas supply pipe 247a is connected at a downstream side further than the valve 244d of the second gas supply pipe 244a. An active auxiliary gas supply source 247b, an MFC 247c, and a valve 247d are installed in the active auxiliary gas supply pipe 247a sequentially from the corresponding upstream side.

Then, an active auxiliary gas is supplied from the active auxiliary gas supply pipe 247a into the shower head 230 via the MFC 247c, the valve 247d, the second gas supply pipe 244a, and the RPU 244e.

The active auxiliary gas acts as a carrier gas of the second process gas, and further, is a gas for suppressing deactivation of active species. Specifically, it may be possible to use, for example, a rare gas such as an Ar gas or the like. In addition, it may be possible to use, in addition to the Ar gas, for example, a He gas, a Ne gas or the like as long as they contain a Group 18 element.

An active auxiliary gas supply system is mainly configured by the active auxiliary gas supply pipe 247a, the MFC 247c, and the valve 247d. The active auxiliary gas supply source 247b, the RPU 244e and the second gas supply pipe 244a may be regarded as being included in the active auxiliary gas supply system.

Furthermore, the active auxiliary gas supply system may be included in the second gas supply system 244.

(Third Gas Supply System)

A third gas supply source 245b, an MFC 245c, and a valve 245d are installed in the third gas supply pipe 245a sequentially from the corresponding upstream side. Then, an inert gas as a purge gas is supplied from the third gas supply pipe 245a to the shower head 230 via the MFC 245c, the valve 245d, and the common gas supply pipe 242.

Here, the inert gas acts as a purge gas for purging a gas staying in the chamber 202 and in the shower head 230. Specifically, for example, an $N_2$ gas may be used.

The third gas supply system 245 is mainly configured by the third gas supply pipe 245a, the MFC 245c, and the valve 245d. The third gas supply source 245b and the common gas supply pipe 242 may be regarded as being included in the third gas supply system 245.

Here, there has been described a case where the third gas supply system 245 supplies the inert gas as a purge gas as an example, but a cleaning gas for removing the byproduct or the like adhering to the inside of the chamber 202 and to the inside of the shower head 230 may be supplied from the third gas supply system 245. As the cleaning gas, it may be possible to use, for example, a nitrogen trifluoride ($NF_3$) gas. Furthermore, it may be possible to use, in addition to the $NF_3$ gas, for example, a hydrogen fluoride (HF) gas, a chlorine trifluoride gas ($ClF_3$) gas, a fluorine ($F_2$) gas or the like, or a combination thereof (Exhaust System)

An exhaust system configured to exhaust the atmosphere of the chamber 202 has a plurality of exhaust pipes connected to the chamber 202. Specifically, the exhaust system has an exhaust pipe (first exhaust pipe) 263 connected to the buffer space 232, an exhaust pipe (second exhaust pipe) 262 connected to the process space 205, and an exhaust pipe (third exhaust pipe) 261 connected to the transfer space 206. In addition, an exhaust pipe (fourth exhaust pipe) 264 is connected to the downstream side of each of the exhaust pipes 261, 262 and 263.

The exhaust pipe 261 is installed so as to be connected to the side surface or the bottom surface of the lower vessel 202b. A pump 265 (turbo molecular pump: TMP) is installed in the exhaust pipe 261. In the exhaust pipe 261, a valve 266 as a first exhaust valve for the transfer space is installed at the upstream side of the pump 265.

The exhaust pipe 262 is installed so as to be connected to the upper vessel 202a, namely a lateral side of the process space 205. An auto pressure controller (APC) 276, which is a pressure controller for controlling the interior of the process space 205 to a predetermined pressure, is installed in the exhaust pipe 262. The APC 276 has a valve body (not shown) whose opening degree can be adjusted, and adjusts the conductance of the exhaust pipe 262 according to an instruction from a controller 280 which will be described later. In addition, a valve 275 is installed in the exhaust pipe 262 at the upstream side of the APC 276. The exhaust pipe 262, the valve 275, and the APC 276 may be collectively referred to as a process space exhaust part.

The exhaust pipe 263 is connected to the shower head 230 so as to communicate with the buffer space 232. The exhaust pipe 263 is connected between the dispersion holes 234a and the lower end of the gas guide 235 in the height direction. A valve 279 is included in the exhaust pipe 263. The exhaust pipe 263 and the valve 279 may be collectively referred to as a shower head exhaust part.

A dry pump (DP) 278 is installed in the exhaust pipe 264. As illustrated, the exhaust pipe 263, the exhaust pipe 262, and the exhaust pipe 261 are connected to the exhaust pipe 264 from the corresponding upstream side, and the DP 278 is installed at the downstream side thereof. The DP 278 exhausts the atmosphere of each of the buffer space 232, the process space 205, and the transfer space 206 via each of the exhaust pipe 262, the exhaust pipe 263, and the exhaust pipe 261. When the TMP 265 is activated, the DP 278 also serves as its auxiliary pump. That is, since it is difficult for the TMP 265, which is a high vacuum (or ultra-high vacuum) pump, to perform exhaust alone up to an atmospheric pressure, the DP 278 is used as an auxiliary pump for performing the exhaust up to the atmospheric pressure. For each valve of the exhaust system, for example, an air valve is used.

(Controller)

Figure 2:
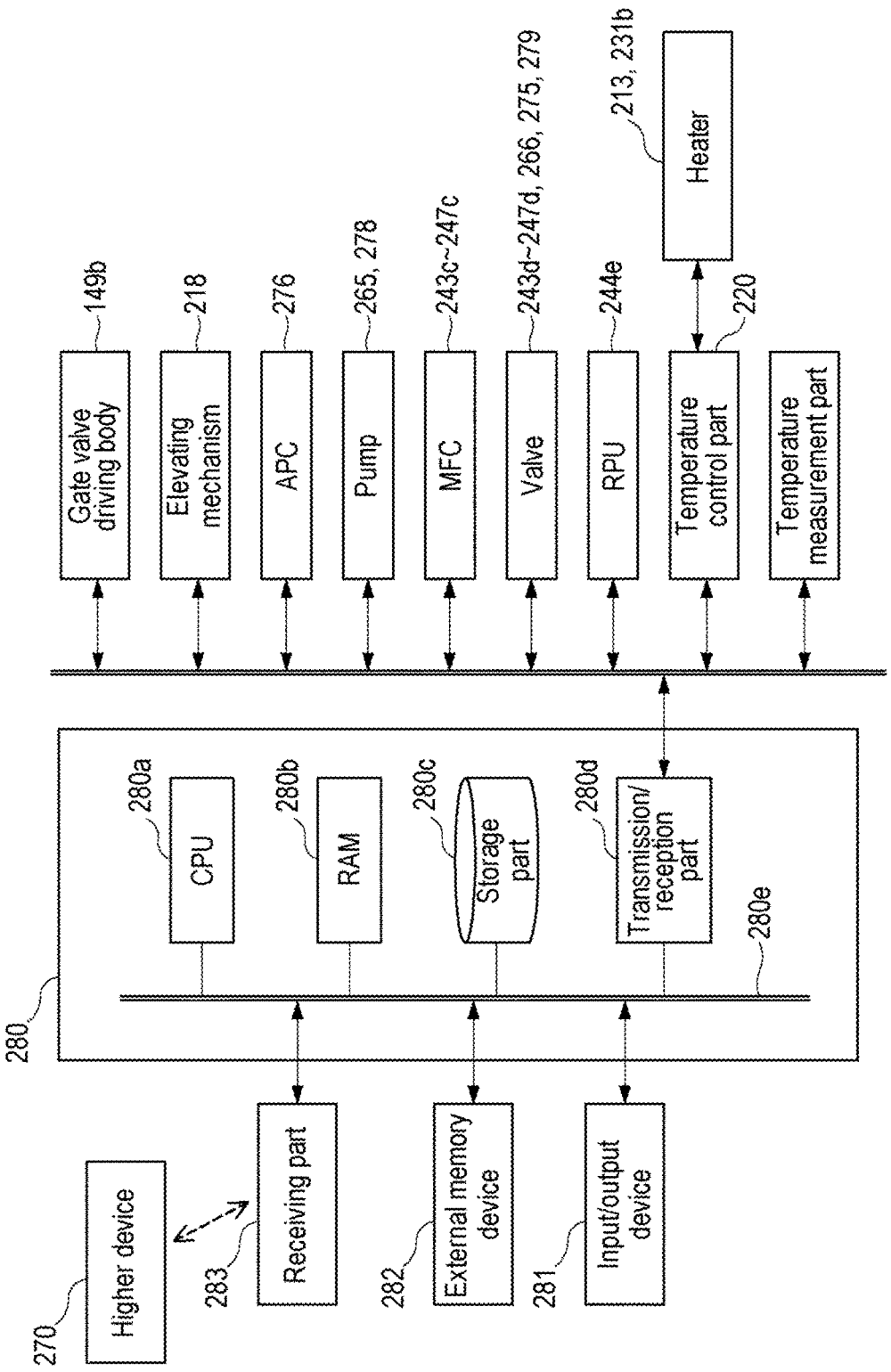
FIG. 2 is a block diagram schematically illustrating a configuration example of a controller of the substrate processing apparatus according to one embodiment of the present disclosure.

The substrate processing apparatus 100 has the controller 280 as a control part configured to control the operations of the respective parts of the substrate processing apparatus 100. FIG. 2 is a block diagram schematically illustrating a configuration example of the controller of the substrate processing apparatus according to the present embodiment.

As illustrated in FIG. 2, the controller 280 is configured as a computer including at least a central processing unit (CPU) 280a, a random access memory (RAM) 280b, a storage part 280c, and a transmission/reception part 280d. The RAM 280b, the storage part 280c, and the transmission/reception part 280d are configured to exchange data with the CPU 280a via an internal bus 280e.

In addition, the controller 280 is configured to be able to be connected with an input/output device 281 such as, for example, a touch panel or the like, and an external memory device. Information can be input from the input/output device 281 to the controller 280. Furthermore, the input/output device 281 is configured to display and output the information under the control of the controller 280. It is also configured such that a network can be connected to the controller 280 through a receiving part 283. This means that the controller 280 can also connect with a higher device 270 such as a host computer existing over a network 8.

The storage part 280c is configured by, for example, a flash memory, a hard disk drive (HDD), or the like. A control program for controlling operations of the substrate processing apparatus 100, a process recipe for specifying sequences and conditions of substrate processing, operation data or processing data generated during a process for setting the process recipe used for processing the wafer 200, or the like is readably stored in the storage part 280c. The process recipe functions as a program for causing the controller 280 to execute each sequence in the substrate processing to obtain a predetermined result. Hereinafter, the process recipe and the control program will be generally and simply referred to as a "program". Furthermore, when the term "program" is used herein, it may indicate a case of including only the process recipe, a case of including only the control program, or a case of including both the process recipe and the control program. The RAM 280b is configured as a memory area (work area) in which a program, operation data or processing data read by the CPU 280a is temporarily stored.

The respective components of the substrate processing apparatus 100 including the MFCs 243c to 247c, the valves 243d to 247d, the RPU 244e and the like are connected to the transmission/reception part 280d. The CPU 280a is configured to read the program from the storage part 280c and execute the same. Thus, the controller 280 allows the CPU 280a to read the program according to an instruction from an operator who operates the higher device 270 or the input/output device 281, and to control the operation of the respective components of the substrate processing apparatus 100 according to the contents thereof.

The controller 280 may be configured as a dedicated computer or a general-purpose computer. For example, the controller 280 may be configured by installing, on the general-purpose computer, the aforementioned program stored in the external memory device 282 (for example, a magnetic tape, a magnetic disk such as a flexible disk or a hard disk, an optical disc such as a CD or DVD, a magneto-optical disc such as an MO, or a semiconductor memory such as a USB memory (USB flash drive) or a memory card). Furthermore, means for supplying the program to the computer is not limited to the case of supplying it through the external memory device 282. For example, the program may be supplied to the computer using a communication means such as the Internet or a dedicated line, or by receiving the information from the higher device 270 through the receiving part 283, instead of the external memory device 282. The controller 280 may also be instructed by using the input/output device 281 such as a keyboard or a touch panel.

The storage part 280c in the controller 280 and the external memory device 282 that can be connected to the controller 280 are configured as a non-transitory computer-readable recording medium. Hereinafter, the storage part 280c and the external memory device 282 will be generally and simply referred to as a "recording medium." When the term "recording medium" is used herein, it may indicate a case of including only the storage part 280c, a case of including only the external memory device 282, or a case of including both the storage part 280c and the external memory device 282.

(2) Overview of the Substrate Processing

Next, an overview of substrate processing of performing a predetermined process on the wafer 200 using the substrate processing apparatus 100 will be described. Here, as the substrate processing, a case where a thin film is formed on the wafer 200 is taken as an example. In the following descriptions, the operations of the respective parts constituting the substrate processing apparatus 100 are controlled by the controller 280.

(Substrate Loading and Mounting Process)

A substrate loading and mounting process will be described.

In the substrate processing, first, the wafer 200 is loaded into the process space 205. Specifically, the substrate support part 210 is moved down by the elevating mechanism 218 such that the lift pins 207 protrude from the through holes 214 to the upper surface side of the substrate support part 210. Furthermore, the internal pressure of the process space 205 and the internal pressure of the transfer space 206 are adjusted to predetermined pressure, and then, the gate valve 149 is opened to mount the wafer 200 on the lift pins 207 from the gate valve 149. After the wafer 200 is mounted on the lift pins 207, the substrate support part 210 is moved up by the elevating mechanism 218 to a predetermined position. Accordingly, the wafer 200 is transferred from on the lift pins 207 to on the substrate support part 210, and is mounted on the substrate mounting surface 211 of the substrate mounting table 212. That is, the wafer 200 is located at the processing position (substrate processing position) within the process space 205 as described above.
(Depressurization and Temperature Raising Process)

Subsequently, a depressurization and temperature raising process will be described.

The interior of the process space 205 is exhausted via the exhaust pipe 262 such that the interior of the process space 205 reaches a desired pressure (degree of vacuum). In this operation, the valve opening degree of the APC 276 is feedback-controlled based on a pressure value measured by a pressure sensor (not shown). Accordingly, the pressure of the process space 205 is maintained at a high vacuum of, for example, $10^{-5}$ to $10^{-1}$ Pa. The amount of electric power supplied to the heater 213 is feedback-controlled based on the temperature value detected by the temperature sensor (not shown) such that the interior of the process space 205 becomes a desired temperature. Specifically, the substrate mounting table 212 is heated in advance, and is left for a predetermined period of time after the temperature change of the wafer 200 or the substrate mounting table 212 disappears. The temperature of the wafer 200 is, for example, a room temperature to 800 degrees C., specifically a room temperature to 500 degrees C. Meanwhile, the moisture remaining within the process space 205, a gas degassed from the members or the like is removed by vacuum exhaust or purging by supply of an $N_2$ gas. The preparation before a film-forming process is now completed.
(Film-Forming Process)

The film-forming process will be described.

When the wafer 200 is located at the processing position within the process space 201, the film-forming process is subsequently performed in the substrate processing apparatus 100. The film-forming process is a process of forming a thin film on the wafer 200 by performing an alternate supply process which repeats a process of alternately supplying a first process gas (first element-containing gas) and a second process gas (second element-containing gas) which are process gases different from each other. Details of the film-forming process will be described later.
(Substrate Unloading Process)

A substrate unloading process will be described.

After the film-forming process is completed, the substrate unloading process is subsequently performed in the substrate processing apparatus 100 to unload the wafer 200 from the process space 205. Specifically, the internal temperature of the chamber 202 is dropped to a temperature at which the wafer 200 can be unloaded, the interior of the process space 205 is purged with an $N_2$ gas as an inert gas, and the internal pressure of the chamber 202 is adjusted to a transferable pressure. After the pressure adjustment, the substrate support part 210 is moved down by the elevating mechanism 218 to support the wafer 200 on the lift pins 207 protruding from the surface of the substrate mounting table 212. Accordingly, the wafer 200 is moved from the processing position to the transfer position. Then, after the wafer 200 is mounted on the lift pins 207, the gate valve 149 is opened and the wafer 200 is unloaded to the outside of the chamber 202.

(3) Basic Procedure of the Film-Forming Process

Next, a basic procedure of the film-forming process of the aforementioned substrate processing will be described.

Figure 3:
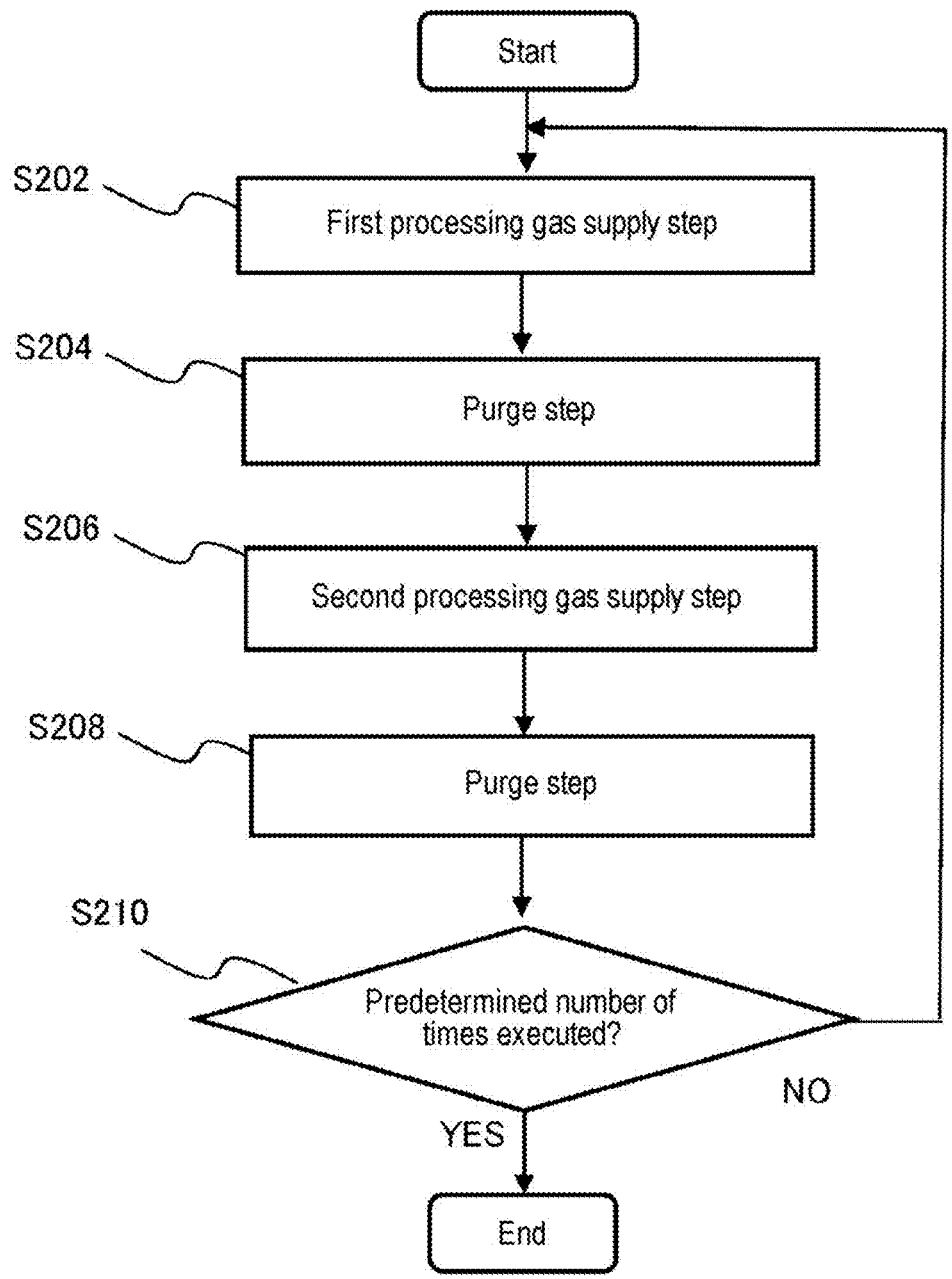
FIG. 3 is a flowchart illustrating a basic procedure of a film-forming process performed in the substrate processing apparatus according to one embodiment of the present disclosure.

FIG. 3 is a flowchart illustrating a basic procedure of the film-forming process performed in the substrate processing apparatus according to the present embodiment.

In the film-forming process, after the temperature of the wafer 200 is raised to a substrate processing temperature, the process of forming a thin film accompanied by heat treatment is performed while keeping the wafer 200 in a predetermined temperature. That is, in the film-forming process, the process of forming a thin film on the surface of the wafer 200 is performed by supplying a process gas in a shower shape through the common gas supply pipe 242 and the shower head 230 toward the surface (process surface) of the wafer 200 arranged in the process spaced 205.

At this time, as illustrated in FIG. 3, an alternate supply process which alternately repeats the supply of the first process gas (the first element-containing gas) and the supply of the second process gas (the gas containing the second element) is performed on the wafer 200 within the process space 205. Hereinafter, in the film-forming process, a case where a silicon nitride (SiN) film is formed as a thin film on the wafer 200 by using a DCS gas as the first processing gas and an $NH_3$ gas as the second processing gas is taken as an example.
(First Process Gas Supply Step: S202)

A first process gas supply step S202 will be described.

In the film-forming process, first, a DCS gas as the first process gas (the first element-containing gas) is supplied from the first gas supply system 243 into the process space 205. At this time, a carrier gas (for example, an $N_2$ gas) of the DCS gas is also supplied from the first inert gas supply pipe 246a into the process space 205.

The DCS gas supplied into the process space 205 reaches the surface of the wafer 200 located at the wafer processing position. Accordingly, a silicon-containing layer as the "first element-containing layer" is formed by bringing the DCS gas into contact with the surface of the wafer 200. The silicon-containing layer is a layer containing silicon (Si) or a layer containing silicon and chlorine (Cl). The silicon-containing layer is formed with a predetermined thickness and predetermined distribution according to, for example, the internal pressure of the chamber 202, the flow rate of the DCS gas, the temperature of the substrate mounting table 212, the time taken to pass the process space 20, and the like. In addition, a predetermined film may be formed in advance on the wafer 200. Also, a predetermined pattern may be formed in advance on the wafer 200 or a predetermined film.

After the lapse of a predetermined period of time from the start of the supply of the DCS gas, the valve 243d is closed to stop the supply of the DCS gas. Furthermore, at the first process gas supply step S202, the valve 275 is opened and the pressure of the process space 205 is controlled to become a predetermined pressure by the APC 276. In addition, at the first process gas supply step S202, the valves of the exhaust system other than the valve 275 are all closed.

The first process gas supply step S202 as described above corresponds to a specific example of a "first step" according to the present disclosure.
(Purge Step: S204)

A purge step S204 will be described.

After the first process gas supply step S202, next, the shower head 230 and the process space 205 are purged by supplying an $N_2$ gas from the third gas supply pipe 245a. Also, at this time, the valve 275 is opened and the pressure of the process space 205 is controlled to become a predetermined pressure by the APC 276. On the other hand, the valves of the exhaust system other than the valve 275 are all closed. Accordingly, the DCS gas that could not be bonded to the wafer 200 at the first process gas supply step S202 is removed from the process space 205 via the exhaust pipe 262 by the DP 278.

Subsequently, the shower head 230 is purged by supplying an $N_2$ gas from the third gas supply pipe 245a. At this time, the valve 275 is closed, while the valve 279 is opened. The other valves of the exhaust system remain closed. That is, when the shower head 230 is purged, the process space 205 and the APC 276 are disconnected from each other and the APC 276 and the exhaust pipe 264 are disconnected from each other to stop the pressure control by the APC 276. On the other hand, the buffer space 232 and the DP 278 communicate with each other. Accordingly, the DCS gas remaining within the shower head 230 (the buffer space 232) is discharged from the shower head 230 via the exhaust pipe 263 by the DP 278.

When the purging of the shower head 230 is completed, the valve 275 is opened to resume the pressure control by the APC 276, and the valve 279 is closed for disconnection between the shower head 230 and the exhaust pipe 264. The other valves of other exhaust systems remain closed. Also, at this time, the supply of the $N_2$ gas from the third gas supply pipe 245a is continued and the purging of the shower head 230 and the process space 205 is continued. At the purge step S204, the purging through the exhaust pipe 263 is performed before and after the purging through the exhaust pipe 262, but only the purging through the exhaust pipe 262 may be performed. Also, the purging through the exhaust pipe 262 and the purging through the exhaust pipe 263 may be simultaneously performed.

(Second Process Gas Supply Step: S206)

A second process gas supply step S206 will be described.

After the purge step S204, next, an $NH_3$ gas as the second process gas (the second element-containing gas) is supplied from the second gas supply system 244 into the process space 205. Also, at this time, a carrier gas (e.g., an Ar gas) of the $NH_3$ gas is supplied from the active auxiliary gas supply pipe 247a into the process space 205.

The $NH_3$ gas and Ar gas become a plasma state by the RPU 244e and are irradiated on the surface of the wafer 200 located at the wafer processing position. Accordingly, the already formed silicon-containing layer is modified to form, for example, an Si film, which is a layer containing an Si element and an N element, on the surface of the wafer 200.

After the lapse of a predetermined period of time, the valve 244d is closed to stop the supply of the $NH_3$ gas. Also, at the second process gas supply step S206, the valve 275 is opened and the pressure of the process space 205 is controlled to become a predetermined pressure by the APC 276 in the same manner as the aforementioned first process gas supply step S202. Also, the valves of the exhaust system other than the valve 275 are all closed.

The second process gas supply step S206 as described above corresponds to a specific example of a "second step" according to the present disclosure.

(Purge process: S208)

A purge step S208 will be described.

After the second process gas supply step S206, the purge step S208 is executed. The operation of each part at the purge step S208 is similar to the case of the purge step S204 described above, and therefore, a description thereof will be omitted here.

(Determination Step: S210)

A determination step S210 will be described.

When the purge step S208 is completed, the controller 280 subsequently sets a series of steps (S202 to S208) described above as one cycle, and determines whether the cycle has been performed a predetermined number of times (n cycle). If the predetermined number of times has not been performed, one cycle from the first process gas supply step S202 to the purge step S208 is repeated. On the other hand, if the predetermined number of times has been performed, the film-forming process is completed.

As described above, in the film-forming process, a SiN film having a predetermined thickness is deposited on the surface of the wafer 200 by sequentially performing the respective steps from the first process gas supply step S202 to the purge step S208. Then, the SiN film formed on the surface of the wafer 200 is controlled to have a desired thickness by setting these steps as one cycle and repeating the cycle a predetermined number of times.

(4) Characteristic Process in the Film-forming Process

Next, a characteristic process in the film-forming process according to the present embodiment will be described.

In the film-forming process according to the present embodiment, as described above, an SiN film having a desired thickness is formed by repeating the supply of the DCS gas at the first process gas supply step S202 and the supply of plasma of the $NH_3$ gas at the second process gas supply step S206, to the wafer 200 located at the wafer processing position. In this film-forming process, in order to favorably form the SiN film, it is necessary to suppress deactivation of active species (radicals) of plasma.

Meanwhile, any of wafers 200 to be processed may be formed with a predetermined pattern in advance. Specifically, there may be a case where a wafer 200 having a three-dimensional (3D) structure such as a deep groove or a deep hole becomes an object to be processed. When such a wafer 200 becomes an object to be processed, as 3D structuration has been progressed, there is a concern that it is difficult for the plasma to reach the inside of the deep groove or the inside of the deep hole in the 3D structure while maintaining the excited state of the plasma. In particular, it is estimated that the deactivation of radicals will be remarkable under a high pressure condition. When the radicals of plasma are deactivated before reaching the bottom of the deep groove or the deep hole in the 3D structure, the film formation on the bottom cannot be favorably performed, and as a result, the formed film thickness of a film may be insufficient.

In the film-forming process according to the present embodiment, for example, also in the case of the wafer 200 in which the 3D structuration has been progressed, in order to make the plasma of the excited state reach the deep groove or the deep hole in the 3D structure while suppressing deactivation therein, the process of the pattern is performed as follows.

(First Process Pattern)

First, a first process pattern will be described.

Figure 4:
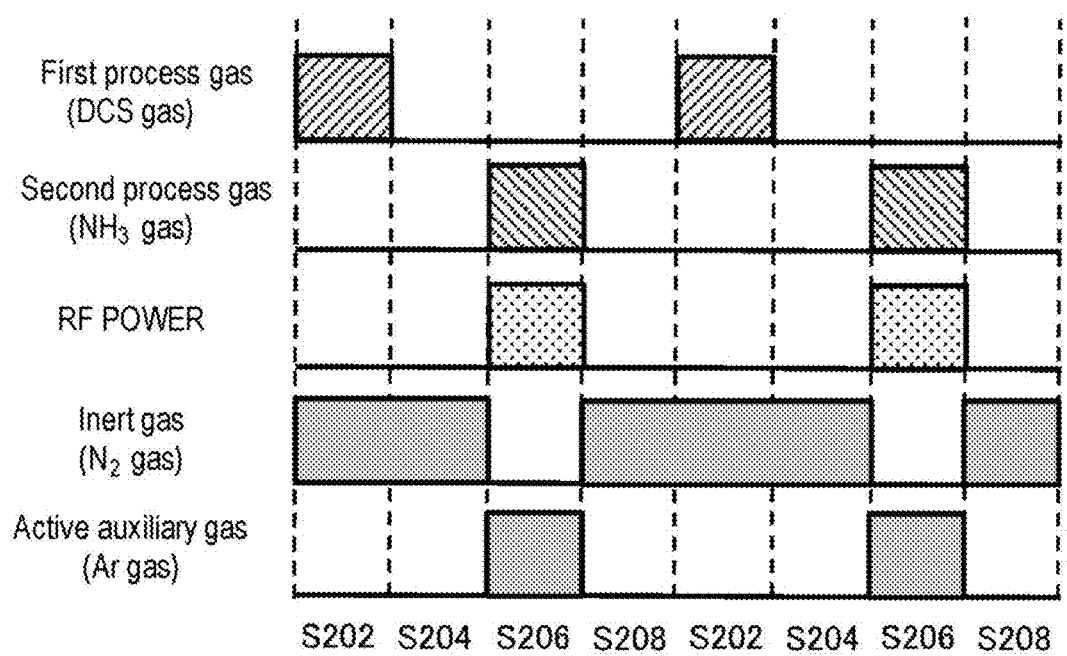
FIG. 4 is a chart illustrating an example of a first process pattern of the film-forming process performed in the substrate processing apparatus according to one embodiment of the present disclosure.

FIG. 4 is a chart illustrating an example of a first process pattern of the film-forming process performed in the substrate processing apparatus according to the present embodiment.

As illustrated in FIG. 4, in the first process pattern, the DCS gas as the first process gas (the first element-containing gas) is supplied and the $N_2$ gas which is an inert gas is supplied as a carrier gas of the DCS gas at the first process gas supply step S202. Then, after the supply of the $N_2$ gas which is an inert gas as a purge gas at the purge step S204, the NH$_3$ gas as the second process gas (the second element-containing gas) is supplied and the Ar gas which is an active auxiliary gas is supplied as a carrier gas of the NH$_3$ gas at the second process gas supply step S206. Thereafter, the N$_2$ gas which is an inert gas is supplied as a purge gas at the purge step S208, and these respective steps are set as one cycle and the cycle is repeated a predetermined number of times.

As described above, in the first process pattern, the N$_2$ gas which is an inert gas is supplied as a carrier gas at the first process gas supply step S202, and the Ar gas which is the active auxiliary gas is supplied as the carrier gas at the second process gas supply step S206. That is, at the first process gas supply step S202 and the second process gas supply step S206, the type of the supplied carrier gas is switched.

The reason for switching the type of the carrier gas is as follows. The Ar radicals are in a metastable state, have a long lifetime, and further have the property of activating the NH$_3$ gas which is a reactant. Therefore, by switching the type of the carrier gas from the N$_2$ gas to the Ar gas, it is possible to prolong the lifetime of the plasma component of the NH$_3$ gas which is a reactant. If the lifetime of the plasma component of the NH$_3$ gas is prolonged, there is an increased probability that the plasma of the NH$_3$ gas in an excited state will reach the bottom of the deep groove or the deep hole in the 3D structure even when the wafer 200 in which the 3D structuration has been progressed becomes an object to be processed. Therefore, there is no case where the formed film thickness of the SiN film will be insufficient even in the bottom of the deep groove or the deep hole.

Furthermore, in the first process pattern, the relatively expensive Ar gas is limitedly used at the second process gas supply step S206, and the relatively inexpensive N$_2$ gas is supplied at each of the other steps. In this manner, by limitedly using the Ar gas which is the active auxiliary gas only at a necessary timing, the total cost required in the film-forming process can also be suppressed from becoming excessive while allowing the plasma of the NH$_3$ gas to reach the bottom of the deep groove or the deep hole.

(Second Process Pattern)

Next, a second process pattern will be described. Here, differences from the aforementioned first process pattern will be mainly described.

FIG. 5 is a chart illustrating an example of a second process pattern of the film-forming process performed in the substrate processing apparatus according to the present embodiment.

Figure 5A:
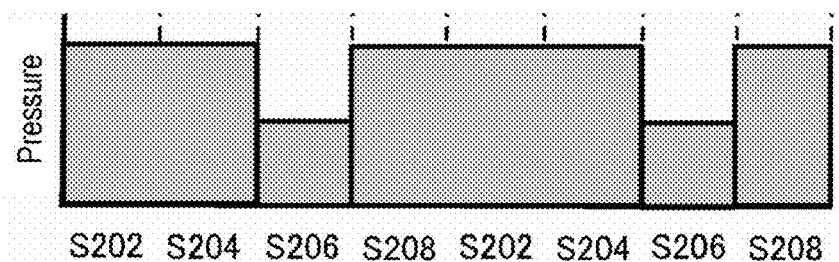
FIGS. 5A and 5B are charts illustrating an example of a second process pattern of the film-forming process performed in the substrate processing apparatus according to one embodiment of the present disclosure.

In the second process pattern, as illustrated in FIG. 5A, when the Ar gas which is an active auxiliary gas is supplied as the carrier gas at the second process gas supply step S206 and when the N$_2$ gas as an inert gas is supplied at each of the other steps, the internal pressure of the process space 205 is set differently. Specifically, a second pressure which is a pressure when the Ar gas is supplied is set lower than a first pressure which is a pressure when the N$_2$ gas is supplied.

It may be considered that this pressure control is performed by respectively adjusting, for example, a supply volume of the NH$_3$ gas by the second gas supply system 244 and a supply volume of the Ar gas by the active auxiliary gas supply system.

Figure 5B:
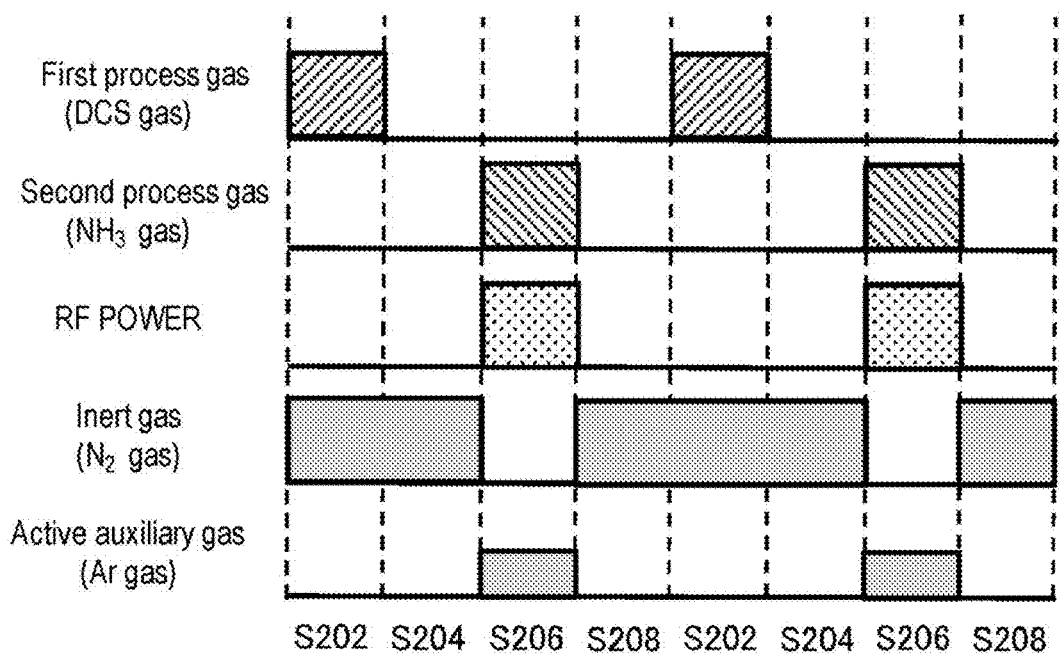

Also, in the second process pattern, the same process as in the case of the aforementioned first process pattern is performed, except that only the second process gas supply step S206 is set at a lower pressure, as illustrated in FIG. 5B.

The reason why only the second process gas supply step S206 is set at a low pressure is as follows. In general, under the high pressure condition, there is a high possibility that the radicals of plasma will collide with each other, and thus, it is presumed that the deactivation of radicals will be remarkable. Based on this fact, at the second process gas supply step S206 of supplying plasma to the wafer 200, the probability that the radicals of plasma will collide with each other is lowered by setting the interior of the process space 205 to a lower pressure than that of each of the other steps. If the collision probability between the radicals is lowered, it is possible to suppress the deactivation of the plasma component of the NH$_3$ gas which is a reactant. If the deactivation of the plasma component of the NH$_3$ gas can be suppressed, there is an increased probability that the plasma of the NH$_3$ gas in an excited state will reach the bottom of the deep groove or the deep hole in the 3D structure even when the wafer 200 in which the 3D structuration has been progressed is an object to be processed. Therefore, there is no case where the formed film thickness of the SiN film will be insufficient even in the bottom of the deep groove or the deep hole.

(Third Process Pattern)

Next, a third process pattern will be described. Here, differences from the aforementioned second process pattern will be mainly described.

Figure 6:
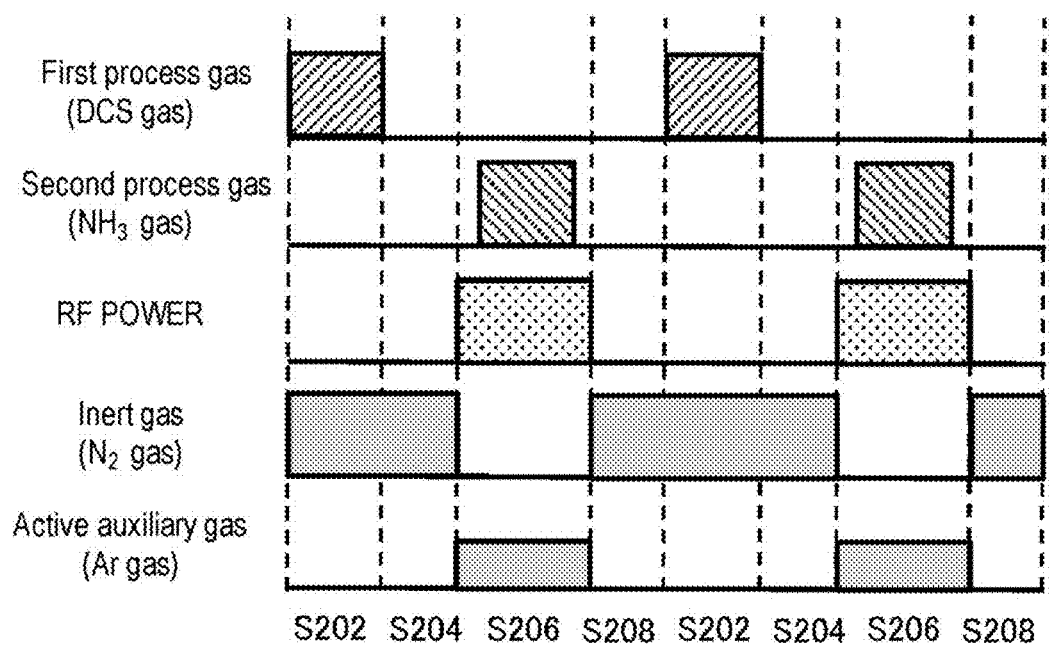
FIG. 6 is a chart illustrating an example of a third process pattern of the film-forming process performed in the substrate processing apparatus according to one embodiment of the present disclosure.

FIG. 6 is a chart illustrating an example of a third process pattern of the film-forming process performed in the substrate processing apparatus according to the present embodiment.

In the third process pattern, as illustrated in FIG. 6, the respective supply timings of the NH$_3$ gas as the second process gas (the second element-containing gas) and the Ar gas which is the active auxiliary gas as the carrier gas thereof are different from those of the first process pattern or the second process pattern. Specifically, in the third process pattern, at the second process gas supply step S206, the supply of the NH$_3$ gas which is the second process gas (the second element-containing gas) in a plasma state to the process space 205 starts after the start of the supply of the Ar gas which is the active auxiliary gas in a plasma state to the process space 205. That is, the respective supply timings of the Ar gas and the NH$_3$ gas are the same in the first process pattern or the second process pattern, but a deviation in the respective supply timings occurs, as the NH$_3$ gas is supplied after the supply of the Ar gas in the third process pattern.

The reason why a deviation in the supply timings of the Ar gas and the NH$_3$ gas occurs is as follows. The Ar radicals are in a metastable state, have a long lifetime, and further have the property of activating the NH$_3$ gas which is a reactant. Therefore, by starting the supply of the Ar gas which is the active auxiliary gas in a plasma state and setting the interior of the process space 205 to an Ar gas atmosphere in a plasma state in advance, it is possible to prolong the lifetime of the plasma component of the NH$_3$ gas which is a reactant subsequently supplied. If the lifetime of the plasma component of the NH$_3$ gas is prolonged, there is an increased probability that the plasma of the NH$_3$ gas in an excited state will reach the bottom of the deep groove or the deep hole in the 3D structure even when the wafer 200 whose 3D structuration has been progressed is an object to be processed. Therefore, there is no case where the formed film thickness of the SiN film will be insufficient even in the bottom of the deep groove or the deep hole.

Also, in the third process pattern, the same processing as, for example, in the case of the aforementioned second process pattern is performed, except that a deviation in the supply timings occurs. In the third process pattern, a case where only the second process gas supply step S206 is set at a low pressure is taken as an example, as in the case of the second process pattern (see FIG. 6), but the present disclosure is not necessarily limited thereto. That is, also in the third process pattern, the internal pressures of the process space 205 at each step may not be set different from each other as in the case of the first process pattern.

(5) Effects according to the Present Embodiment

According to the present embodiment, one or more effects as set forth below may be achieved.

(a) In the present embodiment, the inert gas (for example, an $N_2$ gas) is used as the carrier gas at the first processing supply step S202 of supplying the first process gas (the first element-containing gas), while the active auxiliary gas (for example, an Ar gas) is used as the carrier gas at the second process gas supply step S206 of supplying plasma of the second process gas (the second element-containing gas). That is, the type of the carrier gas is switched such that the active auxiliary gas is used as the carrier gas at least at the step of performing plasma irradiation.

By switching the type of the carrier gas, in the present embodiment, it is possible to favorably process the wafer 200 in the film-forming process. For example, the radicals of Group 18 element (e.g., Ar) in the active auxiliary gas are in a metastable state, have a long lifetime, and further have the property of activating the second process gas (for example, an $NH_3$ gas) functioning as a reaction gas or a modifying gas. Therefore, by switching the type of the carrier gas from the inert gas to the active auxiliary gas, it is possible to prolong the lifetime of the plasma component of the second process gas. If the lifetime of the plasma component of the second process gas is prolonged, there is an increased probability that the plasma of the second process gas in an excited state will reach the bottom of the deep groove or the deep hole in the 3D structure, for example, even when the wafer 200 in which the 3D structuration has been progressed is an object to be processed. Therefore, there is no case where the formed film thickness of the film (for example, a SiN film) in the film-forming process will be insufficient even in the bottom of the deep groove or the deep hole, and as a result, it is possible to favorably process the wafer 200 in the film-forming process.

Moreover, in the present embodiment, the relatively expensive active auxiliary gas is limitedly used at the second process gas supply step S206, and the relatively inexpensive inert gas is supplied at each of the other steps. By limitedly using the active auxiliary gas only at the necessary timing in this way, it is possible to suppress the total cost required in the film-forming process from being excessive while allowing the plasma of the second process gas to reach the bottom of the deep grove or the deep hole. This point is also useful in favorably processing the wafer 200 in the film-forming process.

(b) In the present embodiment, the type of the gas is switched between the $N_2$ gas and the Ar gas by using the $N_2$ gas as the inert gas and the Ar gas as the active auxiliary gas. Therefore, according to the present embodiment, it is possible to ensure the effects of switching the type of the gas as described above while allowing these gases to function as the carrier gas (namely while avoiding adversely affecting the processing by the first process gas and the second process gas).

(c) In the present embodiment, at the second process gas supply step S206 of performing plasma irradiation, the second process gas (for example, an $NH_3$ gas) is supplied in a state in which the interior of the process space 205 is set at a pressure lower than that of the other steps. In this manner, if only the second process gas supply step S206 is set to a low pressure, it is possible to favorably process the wafer 200 in the film-forming process even more.

Generally, under the high pressure condition, there is a high possibility that the radicals of plasma will collide with each other, and thus, it is presumed that the deactivation of radicals will be remarkable. In the present embodiment, at the second process gas supply step S206 where the plasma irradiation is performed, by setting the interior of the process space 205 at a lower pressure than those of the other steps, the probability of collision between the radicals of plasma is lowered. If the collision probability between the radicals is lowered, it is possible to suppress the deactivation of the plasma component of the second process gas (for example, an $NH_3$ gas) functioning as a reaction gas or a modifying gas. If the deactivation of the plasma component of the second process gas can be suppressed, there is an increased probability that the plasma of the second process gas in an excited state will reach the bottom of the deep groove or the deep hole in the 3D structure even when the wafer 200 in which the 3D structuration has been progressed is an object to be processed. Therefore, there is no case where the thickness of the film (for example, an SiN film) formed in the film-forming process becomes insufficient even in the bottom of the deep groove or the deep hole, and as a result, it is possible to favorably process the wafer 200 in the film-forming process even more.

(d) In the present embodiment, at the second process gas supply step S206, the supply of the second process gas (for example, an $NH_3$ gas) in a plasma state to the process space 205 starts after the start of the supply of the auxiliary gas (for example, an Ar gas) in a plasma state to the process space 205. That is, a deviation occurs between the respective supply timings, as the second process gas is supplied after the supply of the active auxiliary gas.

By allowing such a deviation to occur between the supply timings, in the present embodiment, it is possible to favorably process the wafer 200 in the film-forming process even more. For example, the radicals of Group 18 element (e.g., Ar) in the active auxiliary gas are in a metastable state, have a long lifetime, and further has the property of activating the second process gas (for example, an $NH_3$ gas) functioning as a reaction gas or a modifying gas. Therefore, by starting the supply of the active auxiliary gas in a plasma state to thereby put the interior of the process space 205 into the active auxiliary gas atmosphere in a plasma state in advance, it is possible to prolong the lifetime of the plasma component of subsequently supplied second process gas. If the lifetime of the plasma component of the second process gas is prolonged, there is an increased probability that the plasma of the second process gas in an excited state will reach the bottom of the deep groove or the deep hole in the 3D structure even when the wafer 200 in which the 3D structuration has been progressed is and object to be processed. Therefore, there is no case where the thickness of the film (for example, an SiN film) formed in the film-forming process becomes insufficient also in the bottom of the deep groove or deep hole, and as a result, it is possible to favorably process the wafer 200 in the film-forming process even more.

Other Embodiments

While one embodiment of the present disclosure has been specifically described above, the present disclosure is not limited to the aforementioned embodiment but may be differently modified without departing from the spirit of the present disclosure.

In the aforementioned embodiment, there has been described as an example a case where an SiN film is formed on the wafer 200 by alternately supplying a DCS gas used as the first process gas (the first element-containing gas) and an $NH_3$ gas used as the second process gas (the second element-containing gas) in the film-forming process which is one of the substrate processing, the present disclosure is not limited thereto. That is, the process gas used for the film-forming process is not limited to the DCS gas, the $NH_3$ gas or the like, and other kinds of thin films may be formed using other kinds of process gases. Furthermore, the present disclosure may be applied to a case where three or more kinds of process gases are used as long as the film-forming process is performed by alternately supplying these gases. Specifically, various elements such as, e.g., Ti, Zr, Hf or the like, instead of Si, may be used as the first element. Also, for example, O or the like, instead of N, may be used as the second element.

In addition, in the aforementioned embodiment, there has been mainly described as an example a case where a thin film is formed on the surface of the wafer as the substrate processing, but the present disclosure is not limited thereto. That is, the present disclosure may be applied to a process of forming a film other than the thin film exemplified in the aforementioned embodiment, in addition to the thin film formation exemplified in the aforementioned embodiment. Furthermore, the present disclosure may be applied to a case where other substrate processing such as heat treatment (annealing treatment), plasma treatment, diffusion treatment, oxidation treatment, nitriding treatment, or lithography treatment, as well as the film-forming process, is performed, regardless of the specific contents of the substrate processing.

Moreover, in the aforementioned embodiment, there has been described a case where the processing of a wafer is performed as one of the manufacturing processes of a semiconductor device as an example but the present disclosure is not limited thereto. That is, the substrate to be processed is not limited to the wafer but may be a photomask, a printed wiring board, a liquid crystal panel, a magnetic disk, an optical disc, or the like.

Aspects of the Present Disclosure

Hereinafter, some aspects of the present disclosure will be additionally stated as supplementary notes.

[Supplementary Note 1]

According to one aspect of the present disclosure, there is provided a method of manufacturing a semiconductor device, including:

supplying a first process gas to a process space where a substrate is accommodated, and using an inert gas as a carrier gas of the first process gas; and supplying plasma of a second process gas to the process space where the substrate is accommodated, and using an active auxiliary gas as a carrier gas of the second process gas.

[Supplementary Note 2]

In the method of Supplementary Note 1, desirably, a cyclic process of repeating the act of supplying the first process gas and the act of supplying the plasma is performed.

[Supplementary Note 3]

In the method of Supplementary Note 1 or 2, desirably, the first process gas is a precursor gas, and the second process gas is a reaction gas or a modifying gas.

[Supplementary Note 4]

In the method of any one of Supplementary Notes 1 to 3, desirably, the inert gas is an $N_2$ gas, and the active auxiliary gas is an Ar gas.

[Supplementary Note 5]

In the method of any one of Supplementary Notes 1 to 4, desirably, in the act of supplying the plasma, the second process gas is supplied by setting an interior of the process space to a pressure lower than those of other acts.

[Supplementary Note 6]

In the method of any one of Supplementary Notes 1 to 5, desirably, in the act of supplying the plasma, the supply of the second process gas to the process space starts after start of the supply of the active auxiliary gas in a plasma state to the process space.

[Supplementary Note 7]

According to another aspect of the present disclosure, there is provided a substrate processing apparatus, including:

a process space configured to accommodate a substrate;

a first gas supply system configured to supply a first process gas to the process space;

an inert gas supply system configured to supply an inert gas as a carrier gas of the first process gas to the process space;

a second gas supply system configured to supply a second process gas to the process space;

an active auxiliary gas supply system configured to supply an active auxiliary gas as a carrier gas of the second process gas to the process space; and a plasma generation part configured to excite at least one of the second process gas and the active auxiliary gas in a plasma state.

[Supplementary Note 8]

The apparatus of Supplementary Note 7 desirably includes a controller configured to control operations of the first gas supply system, the inert gas supply system, the second gas supply system, the active auxiliary gas supply system and the plasma generating part so as to perform the supply of the first process gas and the supply of the second process gas as a cyclic process.

[Supplementary Note 9]

According to still another aspect of the present disclosure, there is provided a program that causes, by a computer, a substrate processing apparatus to perform a process, the process including:

supplying a first process gas to a process space in a state where a substrate is accommodated, and using an inert gas as a carrier gas of the first process gas; and supplying plasma of a second process gas to the process space in a state where the substrate is accommodated, and using an active auxiliary gas as a carrier gas of the second process gas.

[Supplementary Note 10]

According to still another aspect of the present disclosure, there is provided a non-transitory computer-readable recording medium storing a program that causes, by a computer, a substrate processing apparatus to perform a process, the process comprising:

supplying a first process gas to a process space in a state where a substrate is accommodated, and using an inert gas as a carrier gas of the first process gas; and supplying plasma of a second process gas to the process space in a state where the substrate is accommodated, and using an active auxiliary gas as a carrier gas of the second process gas.

According to the present disclosure in some embodiments, it is possible to favorably process a substrate.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a semiconductor device, comprising:
   supplying a first process gas to a process space where a substrate is accommodated, and using an inert gas as a carrier gas of the first process gas; and
   supplying plasma of a second process gas to the process space where the substrate is accommodated, and using an active auxiliary gas, which is different from the inert gas, as a carrier gas of the second process gas,
   wherein the plasma of the second process gas is supplied without the inert gas, which is used in the act of supplying the first process gas,
   wherein the inert gas is supplied in the act of supplying the first process gas without supplying the active auxiliary gas, which is used in the act of supplying the plasma of the second process gas, and
   wherein the act of supplying the plasma is performed by setting an internal pressure of the process space to be lower than an internal pressure of the process space in the act of supplying the first process gas.

2. The method of claim 1, wherein in the act of supplying the plasma, the supply of the second process gas to the process space starts after the start of the supply of the active auxiliary gas in a plasma state to the process space.

3. The method of claim 2, wherein a cyclic process of repeating the act of supplying the first process gas and the act of supplying the plasma is performed.

4. The method of claim 3, wherein the first process gas is a precursor gas, and
   the second process gas is a reaction gas or a modifying gas.

5. The method of claim 4, wherein the inert gas is an $N_2$ gas, and the active auxiliary gas is an Ar gas.

6. The method of claim 2, wherein the first process gas is a precursor gas, and the second process gas is a reaction gas or a modifying gas.

7. The method of claim 2, wherein the inert gas is an $N_2$ gas, and the active auxiliary gas is an Ar gas.

8. The method of claim 1, wherein in the act of supplying the plasma, the supply of the second process gas to the process space starts after the start of the supply of the active auxiliary gas in a plasma state to the process space.

9. The method of claim 8, wherein a cyclic process of repeating the act of supplying the first process gas and the act of supplying the plasma is performed.

10. The method of claim 9, wherein the first process gas is a precursor gas, and the second process gas is a reaction gas or a modifying gas.

11. The method of claim 10, wherein the inert gas is an $N_2$ gas, and the active auxiliary gas is an Ar gas.

12. The method of claim 8, wherein the first process gas is a precursor gas, and the second process gas is a reaction gas or a modifying gas.

13. The method of claim 8, wherein the inert gas is an $N_2$ gas, and the active auxiliary gas is an Ar gas.

14. The method of claim 1, wherein a cyclic process of repeating the act of supplying the first process gas and the act of supplying the plasma is performed.

15. The method of claim 14, wherein the first process gas is a precursor gas, and
   the second process gas is a reaction gas or a modifying gas.

16. The method of claim 14, wherein the inert gas is an $N_2$ gas, and the active auxiliary gas is an Ar gas.

17. The method of claim 1, wherein the first process gas is a precursor gas, and the second process gas is a reaction gas or a modifying gas.

18. The method of claim 17, wherein the inert gas is an $N_2$ gas, and the active auxiliary gas is an Ar gas.

19. The method of claim 1, wherein the inert gas is an $N_2$ gas, and the active auxiliary gas is an Ar gas.

* * * * *